United States Patent [19]

Thompson

[11] 4,027,052
[45] May 31, 1977

[54] FABRICATION OF IRON OXIDE PATTERN

[75] Inventor: Larry Flack Thompson, Gillette, N.J.

[73] Assignee: Bell Telephone Laboratories, Incorporated, Murray Hill, N.J.

[22] Filed: July 2, 1975

[21] Appl. No.: 592,366

Related U.S. Application Data

[62] Division of Ser. No. 358,728, May 9, 1973, Pat. No. 3,920,454.

[52] U.S. Cl. .................................. 427/43; 427/229; 427/272; 427/273; 427/287; 428/432; 204/159.14; 156/659

[51] Int. Cl.² ..................... B05D 3/02; B05D 3/06

[58] Field of Search ............. 427/43, 53, 272, 273, 427/282, 287, 341, 229; 428/432; 96/35.1, 36.2, 115 P; 204/159.14; 260/439 CY

[56] References Cited

UNITED STATES PATENTS

| | | | |
|---|---|---|---|
| 3,335,008 | 8/1967 | Dubose | 260/439 CY |
| 3,352,888 | 11/1967 | Matsumago | 260/439 CY |
| 3,437,634 | 4/1969 | Neuse | 260/439 CY |
| 3,490,907 | 1/1970 | Schenk | 260/439 CY |
| 3,577,235 | 4/1971 | Contais | 96/1.5 |
| 3,681,227 | 8/1972 | Szupillo | 96/38.3 |
| 3,695,908 | 10/1972 | Szupillo | 96/38.3 |
| 3,751,247 | 8/1973 | Swan | 96/1.5 |
| 3,824,100 | 7/1974 | Griest | 96/36.2 X |
| 3,833,396 | 9/1974 | Kammlott et al. | 156/3 |
| 3,837,855 | 9/1974 | Rousseau et al. | 96/35 |

*Primary Examiner*—Ronald H. Smith
*Assistant Examiner*—Evan K. Lawrence
*Attorney, Agent, or Firm*—George S. Indig

[57] ABSTRACT

Patterned iron oxide films are produced on substrates by oxidative decomposition of polyvinyl ferrocene. The polymer may be applied to the substrate in the form of a solution by spinning. Resultant films may be relatively soluble or relatively insoluble in acidic media depending upon processing conditions. Soluble films are of interest for hard copy masks designed for use in the fabrication of printed circuits. Such masks may be pattern-delineated by photoresist techniques or by selective insolubilization. Alternatively, patterns may result from selective deposition or removal of the polymer prior to decomposition.

10 Claims, No Drawings

FABRICATION OF IRON OXIDE PATTERN

CROSS-REFERENCE TO RELATED APPLICATIONS

This application is a division of my copending application, Ser. No. 358,728 filed May 9, 1973, now U.S. Pat. No. 3,920,454, and is being filed concurrently with application Ser. No. 592,367 on July 2, 1975 which is also a division of the same copending application.

BACKGROUND OF THE INVENTION

1. Field of the Invention

The invention is concerned with the fabrication of films of primary interest for use as masks or resists in the fabrication of printed circuitry.

2. DESCRIPTION OF THE PRIOR ART

Continuing development of printed circuits and integrated circuits has put increasingly stringent demands on fabrication techniques. Miniaturization combined with greater circuit complexity necessitating many sequential fabrication stages has resulted in a significant decrease in yield.

A particular problem involves the need for accurate registration of masks with patterns produced at intermediate stages in the fabrication of a circuit. An approach which has met some degree of acceptance involves a "see through" mask which may be optically aligned. This approach, implying a degree of transparency in the visible spectrum, as well as a required opacity for some energy used to define the pattern corresponding wish the mask, is apparently satisfied by a film material which largely consists of one or more oxidized compounds of iron. See, for example, 118, *Journal of the Electrochemical Society*, 341 (1971).

Properly prepared films of such material are sufficiently transparent at 5890 Angstrom units for viewing purposes and are sufficiently opaque in the spectral region of from 3600 – 4000 Angstrom units for use as photomasks with an argon-ion laser. Such material is soluble in a number of acidic solutions—e.g., 6N HCl—with complete dissolution occurring within a time on the order of less than 1 hour at room temperature for film thicknesses ordinarily utilized.

The prior art utilizing iron oxide masks has generally made use of photolithographic techniques for pattern delineation. In accordance with this approach, photoresist coatings are exposed and developed in the usual manner following which bared iron oxide is etched away.

It is also known that demand for higher resolution may not be satisifed by use of photoresists and consideration has been given to other techniques which do not have the resolution limitations of photoresists. There are, for example, mask materials in which patterns may be generated by direct light beam "writing," for example, by use of coherent emission, particularly at higher frequencies. There has also been considerable effort directed to pattern generation by electron beam lithography. Apparatus is available for programming a scanning beam so as to "write" patterns directly in a variety of susceptible media. See, for example, *IEEE Transactions on Electron Devices*, ED-19, No. 5, page 624 (1972).

While iron oxide blanks (supported films on substrates of appropriate transparency intended for mask fabrication) are commercially available, it does not follow that all production problems have been solved. The technique which has gained commercial acceptance involves chemical vapor deposition (CVD) from iron pentacarbonyl. Use of an oxidizing atmosphere at temperatures within a specified range (sufficiently high to cause decomposition but insufficient to result in substantial insolubilization) results in film of adequate thickness, uniformity, appropriate optical property, and sufficent solubility to satisfy most purposes.

An objection to the CVD process is the attendant release of carcinogenic material into the atmosphere. It is characterized as well by other difficulties common to CVD processing. Alternative procedures involving sputtering, vaporization, and salt decomposition, are not known to be in commercial use.

SUMMARY OF THE INVENTION

Film material containing oxidized iron is produced on a substrate by oxidation of a polymerized monomer containing ferrocene. Exemplary polymeric material is produced by the addition polymerization of a ferrocene-containing, single hydrocarbon substituent monomer which includes an olefinic bond. Polyvinyl ferrocene is an example of such a material. The polymer, normally solid at room temperature, is applied in solution form with solvent removal and polymer breakdown (to an oxide) occurring during heating in an oxidizing environment.

Depending upon the temperature at which oxidation is carried out, the resulting film may or may not exhibit the solubility and other characteristics of CVD films produced from iron pentacarbonyl. Accordingly, where breakdown is carried out over a temperature range which does not exceed above 400° C, the oxide film is soluble in dilute HCl and shows the requisite transparency—e.g., at the sodium-D line for viewing purposes as well as sufficient opacity in the spectral range from 3600 – 4000 Angstrom units for photolithographic purposes.

Polymeric film may be used to produce polymer blanks in the manner described; and such blanks, if oxidized at temperatures which do not exceed 400° C, may be pattern delineated by photolithography utilizing a photoresist in the manner described in *Handbook of Thin Film Technology*, by L. Maissel and R. Glang, McGraw-Hill, New York (1970) page 7-1+, or, alternatively, by utilizing techniques described in copending U.S. application Ser. No. 358,729, filed on May 9, 1973, (now U.S. Pat. No. 3,833,396 issued on Sept. 3, 1974).

As described in (Kammlott-Sinclair Case 1-11) and application Ser. No. 358,727 filed on May 9, 1973 (Rousseau-Sinclair Case 1-12) (and now U.S. Pat. No. 3,837,855 issued on Sept. 24, 1974), selected portions of oxidized film material may be insolubilized by electron beam or a light exposure, respectively. As disclosed in such copending applications, exposure may be by programmed direct beam writing.

Polymer films which may be applied in accordance wit a variety of procedures including spinning, spraying, rolling, etc., may be pattern delineated before oxidation breakdown, for example, by selective deposition or by selective removal. Selective removal is easily accomplished by selective cross-linking of the polymer, for example, by electron beam irradiation, thereby cross linking (and consequently insolubilizing) portions of the polymer. Actual removal of uncross-linked portions is accomplished by wetting with a "developer, " which is simply any appropriate solvent for the linear polymer. Oxidative breakdown of the now patterned polymer may be under conditions to result in soluble or insoluble film.

Regardless of the type of pattern delineation utilized, it may be desirable to insolubilize the final oxidized film. This may be accomplished simply by heating above 420° C (no atmosphere requirement). Where pattern delineation is carried out prior to oxidation, initial oxidation over a temperature range which sometimes exceeds 420° C results in an insoluble oxide film as formed.

DETAILED DESCRIPTION

1. Oxidized Film Characterization

To expedite description in subsequent sections, oxidized film is hereinafter referred to as iron oxide or $Fe_2O_3$. This is consistent with the general assumption made by prior art workers with respect to characterization of film materials produced by other procedures. There is, however, considerable experimental basis for considering the oxide film to be somewhat more complex, at least under certain conditions. Considering film produced from polymerized ferrocene-containing monomers, it has been determined spectraphotometrically that $Fe(CO_3)_2$ is present in the film possibly in amounts as great as 25 percent by weight or greater, where oxidation was carried out over a temperature range which did not exceed about 380° C. The carbonate is not detected by this technique in films prepared by oxidation of polymer over a temperature range which attains the level of 420° C. Also, certain conditions may result in oxygen loss and consequent formation of some $Fe_3O_4$. This is more usual in insolubilized portions—particularly where heating is carried out in vacuum (as during electron beam irradiation).

Regardless of whether there is detectable carbonate content, films prepared by oxidation of polymer over a temperature range bounded by a maximum value of 400° C show no long range ordering over distances of 50 Angstrom units or greater as determined by X-ray diffraction powder patterns or by electron beam diffraction. Such films which may properly be characterized as amorphous are soluble within the terms of this description. For these purposes, solubility is defined as disappearance of a film of a thickness of 1 $\mu$m when wetted by 6N HCl for 1 hour or less at room temperature (18° C).

Films which have been prepared by oxidation over a temperature range exceeding a value of 420° C for a period of at least 2 hours, as well as films prepared at lower temperature but subsequently heated locally or generally at a temperature of at least 420° C for a period of at least 2 hours evidence the crystalline morphology associated with $\alpha Fe_2O_3$. While this is the morphology that generally characterizes the crystallized film material, there are conditions which do result in deviation, sometimes substantial. For example, where processing includes maintenance at an elevated temperature in vacuum or in other atmosphere in which loss of oxygen results, divalent iron is produced. Films which have been so processed may show appreciable $Fe_3O_4$ content. Patterning in accordance with 6D. )II herein involves electron beam insolubilizing which, since necessarily carried out in vacuum, does result in oxide loss. Analysis of such insolubilized portions may indicate a content of $Fe_3O_4$ which is 50 percent or greater by weight of the total oxidized iron film content. The nature of such modified crystallized portions is, for the purposes associated with the invention, essentially indistinguishable from that of a $\alpha Fe_2O_3$. Such crystalline films or film portions typically exhibit a solubility ratio with respect to uncrystallized film of less than 1/25 in mild acidic solutions, such as, 6N HCl, at room temperature. This is a time ratio indicating that it takes at least 25 times as long to dissolve a given thickness of the crystallized material under appropriate conditions.

For expediency, in the remainder of this description, film material is discussed as though consisting simply of $Fe_2O_3$, which is truly amorphous when low-temperature processed, and as manifesting the crystalline behavior of $\alpha Fe_2O_3$ when high-temperature processed as specified.

The terms "solubility" and "insolubilization" are defined in accordance with this section.

2. The Polymer

The polymeric material found suitable for the practice of this invention is a polymer of a monomeric unit which contains two five-membered rings and a $\pi$-bonded iron atom. In general, each five-membered ring is totally carbonaceous so that this monomeric portion is properly designated as ferrocene. The moiety may, however, be modified by replacement of one or more carbons in the ring; so, for example, fufural ring/s may be substituted. Even though such substitutions are permissible in accordance with the inventive teaching, description is in terms of "ferrocene," it being understood that this material is considered as exemplary only.

Polymerization is ordinarily brought about by the addition process either by a bulk free radical or by an ionic process. Addition polymerization requires an olefinic ring substituent and it is a general requirement therefore that ferrocene, monomer precursors include such a substituent. It is known that polymerization may effectively proceed only where each ferrocene grouping contains but a single olefin substituent; and this, therefore, becomes a further requirement of the monomer unit.

In general, it is desired to maintain the carbon-to-iron ratio at a minimum; and accordingly, a preference exists for the shortest possible olefin substituent. The preferred monomer is therefore vinyl ferrocene (by which is intended monovinyl-ferrocene) and the preferred polymeric product may be characterized as polyvinyl ferrocene. Since polymerization may be carried out with equal facility for monomers containing longer olefinic substituents and since oxidative procedures are identical in fashion, regardless of the length of such substituent, polyvinyl ferrocene is merely preferred. Use of larger substituents, or for that matter inclusion of other (saturated) hydrocarbon substituents elsewhere on either of the rings is permitted but further increases the carbon-to-iron ratio and therefore results in increased shrinkage during oxidation. This may result in lower density oxidized films and may be attended by other disadvantages, such as, voids, cracks, strain, etc. Most problems resulting from larger carbon-to-iron ratio may be alleviated by annealing—e.g., at a temperature of at least 380° C. (The maximum temperature depends on whether an amorphous or crystalline end product is desired.)

In further description, the polymer will be referred to as "polyvinyl ferrocene," although it is to be understood that this compound, too, is exemplary; for example: it is not required that the material be a homopolymer; the olefinic substituent may be longer than the two-carbon vinyl grouping; other substituents may be present (although desirably hydrocarbons); either/or both five-membered rings may be heterocyclic, as by substitution of an oxygen for a carbon, etc.

3. Polymerization and Further Polymer Characterization

This procedure is well known to workers in the art. See, for example, article by John C. Lai et al., *Journal of Polymer Science*, Part A-1, vol. 9, page 651 (1971). Briefly, bulk-free radical addition polymerization may utilize AIBN (azobisisobutyronitrile) as initiator (sometimes designated "catalyst" by workers in this field). Polymerization temperature is based largely on the chemical stability of the initiator. When utilizing AIBN, polymerization is conveniently carried out at 80° C. Time and molecular weight (as well as yield) are interrelated quantities and are both dependent upon the nature and concentration of initiator. As in other types of addition polymerization, polymer molecular weight decreases for increasing initiator contact (since increasing initiator content results in increasing number of initial polymerization sites).

Use of 0.3 percent by weight AIBN based on monomer with polymerization proceeding over a period of 72 hours at a temperature of 80° C results in a molecular weight of 80,000 Mv (viscosity-determined molecular weight in accordance with the *Textbook of Polymer Science* by F. Billmeyer (1962) page 79). Maximum polymer weight on the same basis is about 1 million which may be attained by use of about 0.001 percent AIBN with polymerization proceeding at a temperature of 70° C for a period of about 72 hours. This maximum is prescribed in view of economical considerations, as well as initiator half life, since larger molecular weights require still longer polymerization time. A minimum polymer molecular weight is not simply set forth, since other parameters such as film adhesion are consequential. In general a molecular weight of 3,000 or less on the same basis is prescribed by the difficulty in achieving continuity in films of usual desired thickness for lesser chain length.

4. Polymer Solvent

Solvent material is non-critical, the main requirements being that it have sufficient solvent power to contain the desired amount of polymer and that it be removable usually by volatilization at temperatures which do not exceed desired oxidation temperature. In fact, it is generally desired that drying be carried out without substantial oxidation, for which reason solvents are preferably so chosen as to be removable by volatilization at temperatures below about 250° C. Since appropriate solvents are available, drying is conveniently carried out by air drying at room temperature. Solvent power is dependent on molecular weight. For molecular weight of up to about 10,000 Mv trichloroethylene is suitable. For molecular weight of the order from 10,000 to 100,000 Mv, benzene has sufficient power to result in a 10 percent by weight solution; and for weights above 100,000 Mv, chlorobenzene is suitable.

5. Substrates

Films of the invention are supported. Since a significant use of the invention is in the fabrication of see-through hard copy photomasks, substrates for this use must be possessed of the desired transparency properties. Such substrates must have requisite transparency, both at the appropriate visible wavelength (e.g., at or about the sodium-D line) and must also be sufficiently transparent at the wavelength range over which the photomask is to be utilized (e.g., from 3600–4000 Angstrom units). Suitable substrates are: fused silica, sapphire, borosilicate glass, etc. Other uses may require different substrates, for example, pattern-delineated oxides of the invention may be utilized as resists and so may be applied directly to a circuit substrate.

6. Processing

The following assumes a solution of polyvinyl ferrocene in accordance with the above.

a. Application

Solution may be applied to substrate by any appropriate means; for most discriminating use, e.g., preparation of photomasks or resists, spinning has been found desirable, since resultant coatings are of high thickness uniformity. Alternative procedures include spraying, rolling, brushing, dipping, etc. Application is in amount such as to result in a dilute polymer film of from about 1,000 Angstrom units to about 2 $\mu$m. Such polymer films, in the instance of unsubstituted polyvinyl ferrocene, results in an oxide thickness of approximately half that indicated for the polymer layer. As noted later, for thin films—e.g., of the order of 4,000 Angstrom units or less—application may be in multiple steps, desirably with oxidative degradation being carried out following each step.

As indicated, solvent is conveniently removed by air drying at room temperature, although it may be accelerated by heating, for example, at temperatures of up to 100°–⅛° C. For best quality thin films of oxide material, it is desirable to anneal the polymer layer at a temperature above its glass transition temperature (about 120° C) for periods of the order of about 1 hour.

It has been indicated that a minimum polymer film thickness of about 400 Angstrom units is desired for continuity. The maximum of about 1 $\mu$m for a single application results from the observation that oxidation for thicknesses substantially above this limit results in strained layers evidencing cracking. For "see through" masks, a range of from 2,000–2,500 Angstrom units is considered optimum. This range represents a suitable compromise between contrast in the ultraviolet and transparency in the visible.

b. Polymer Pattern Delineation

This is an optional step and is not practiced in article fabrication of or involving an oxide blank. Delineation requires insolubilization of polymer (for example, in a solvent of the nature utilized in Section 4). This solubilization is appropriately characterized as cross-linking; and, as expected, this procedure is governed by an energy threshold and not solely by dosage. Delineation is most expediently carried out utilizing an electron beam, although it is possible that X-ray or short-wavelength light may be utilized. Discussion is largely in terms of electron beam cross-linking. Required energy per cross link is not critically dependent on molecular weight; and experimentally determined beam voltages as set forth below, while determined on the basis of 80,000 Mv polymer are generally applicable to other polymer weights within the range specified in Section 3.

Electron beam voltage is determined by the desire to cross-link polymeric material at the substrate interface. If this portion of the material is not cross-linked, it will be lifted by solvent action during development. Optimum conditions for cross-linking are based on the desire to produce gellation at the interface. A general equation for determining such voltage in terms of film thickness is set forth:

$$Z = 0.046/\rho \, V_a^{1.75}, \tag{1}$$

where Z is film thickness in micrometers; $\rho$ is density (about 1.4 for the prototype polyvinyl ferrocene); $V_a$ is the accelerating voltage in kilovolts.

In general terms, the dosage required for 90 percent film retention is within the range of from about $8 \times 10^{-5}$ to $1.5 \times 10^{-4}$ coulombs per square centimeter. As is well known, higher required dosages correspond with higher beam voltages. Experimentally suitable results have been obtained by use of a 5 kV beam with a dosage of $8 \times 10^{-5}$ coulombs per square centimeter for a half micrometer thick film.

Development is non-critical and may utilize any solvent discussed above. It has been found that a solvent adequate for application of the polymer adequately removes films of up to a micrometer in thickness with a 30 second soak or a 10 second spray at room temperature.

Where less resolution is tolerable, delineation of patterns in polymeric material may be accomplished by selective application of polymer. This may be accomplished, for example, by use of screen printing.

c. Oxidation

This is a necessary step and is practiced on the polymer film whether previously pattern delineated or not. Oxidation parameters are essentially the same for linear or cross-linked materials. Effective oxidation is carried out with a substantial flow of oxygen-bearing gas at the free surface of the polymer layer. For example, for undiluted oxygen, a velocity of the order of at least ¼ centimeter per second at the free surface is preferred. For flow rates substantially lower than this minimum, there is a tendency to form a carbon skeleton upon water evolution and this skeleton is thereafter oxidized only with difficulty and may not yield a homogeneous oxide film without additional processing. For diluent-containing oxidizing media, greater flow rates are required. For example, air oxidation requires a flow rate at least five times as great as the minimum indicated. Oxidation time is temperature dependent with time decreasing for increasing temperature. Preference for the soluble or insoluble form of the oxide residuum dictates a further limitation. Where soluble films are desired, a maximum temperature of about 400° C is prescribed. A minimum of about 250° C results from the observation that lower temperatures require times substantially in excess of 24 hours. Complete oxidation takes place in a usual film thickness at a temperature of 320° C in a period of 3 hours, and at 380° C in a period of about 30 minutes. Increased exposure to oxidizing ambient at temperatures of up to a preferred limit of about 400° C does not result in insolubilization in reasonable periods. For example, films have been exposed to required oxygen flow at a temperature of 380° C for 24 hours with no measurable change in solubility of the resulting oxide. Oxidation processing parameters are not thickness-dependent to a first order approximation up to a film thickness of the order of a micrometer.

Complete oxidation may be spectrophotometrically followed, for example, by following the disappearance of C—H bands, the characteristic infrared absorption bands associated with C—H bands or the appearance of the characteristic iron oxide bands. Alternatively, oxidation may be followed by observation of the very characteristics which recommend the material for "see through" masks—i.e., visibility at the sodium-D line and/or opacity at 3600–4000 Angstrom units radiation.

An alternative oxidation procedure involves use of an r.f. oxygen plasma. This procedure has been used to produce oxide substantially identical to that resulting from thermal oxidation. An advantage inheres in the ability to produce breakdown at room temperature.

d. Pattern Delineation of Oxide

This step is generally an alternative to Step (b); suitable procedures are described elsewhere (see, for example, 120, Journal of the Electrochemical Society, 545 (April 1973)) and are only briefly set forth.

I. Present commercial processing utilizing masks which may be constructed of material produced in accordance with the invention depends on conventional photolithography. In accordance with this procedure, a conventional negative resist material, for example, a sensitized polyisoprene, may be deposited on the oxide surface and exposed through a mask using radiation of a wavelength range of from 3200 to 4100 Angstrom units. Development, for example, in a polyisoprene solvent for a few seconds at room temperature results in removal of unexposed portions of the resist.

Following development of the resist, a suitable etchant—such as, 6N HCl—may be utilized to remove the bared oxide portions. Dissolution of such portions may be accomplished in a few minutes at room temperature. Finally, the developed resist material is removed, for example, by rinsing in a sodium dichromate-sulfuric acid solution at a temperature of 70° C.

II. Utilizing the technique of copending application Ser. No. 358,729 filed on May 9, 1973 (Kammlott-Sinclair 1-11), (and now U.S. Pat. No. 3,833,396 issued Sept. 3, 1974) pattern delineation may be by electron beam. Unlike polymer delineation, oxide insolubilization is work—rather than energy—dependent. The change brought about locally by use of electron beam is believed identical to that which occurs on simple heating at temperatures in excess of about 420° C—i.e., crystallization to $\alpha Fe_2O_3$. Generally, electron beam voltages of about 10 kV with dosage of about $5 \times 10^{-2}$ coulombs per cm² have been found adequate for film thicknesses of the range contemplated.

III. Utilizing the technique described in copending application Ser. No. 358,727 filed on May 9, 1973 (Rousseau-Sinclair 1-12) (and now U.S. Pat. No. 3,837,855 issued Sept. 24, 1974), a concentrated light beam may be substituted for the electron beam. Such a beam is conveniently produced by a laser operating at any suitable wavelength, again resulting in the desired local temperature increase to at least about 420° C. For example, for a beam of a cross section of about 1.5 mm² and power of 1 to 2 watts operating at a wavelength of 5145 Angstrom units, crystallization is accomplished in a period of about 30 seconds.

7. Miscellaneous

In general, variations in the various parameters necessary for the inventive objective have been discussed. Certain modifications in composition, both of the polymer and of the oxide film may be desired. For example, a polymer solution may be modified by addition of a thixotropic agent to increase viscosity and thereby control wetting. Or, alternatively, viscosity may be reduced by use of increased amounts of solvent or by increase in temperature. Wetting solutions, such as fatty acids, may be utilized. In general, chemical purity is not critical, although best films may only be prepared from materials which are free of particulate impurities of oxide film thickness dimension. Accordingly, it is desirable to strain the polymer solution with a filter of sufficiently small size to preclude such particles. For thin films, best defect-free material results from repetition of the entire sequence of processing steps except for the final delineation. Best films 4,000 Angstrom units or less in thickness have resulted by first wetting with sufficient solution to produce an oxide layer of 2,000 Angstrom units and oxidizing, followed by again wetting the now oxide-coated substrate with polymer solution and repeating the sequence.

8. Examples a. A solution to 10 percent polyvinyl ferrocene of molecular weight 80,000 Mv in benzene is applied to a polished fused silica substrate of dimensions 1 inch diameter by ⅛ inch by spinning the substrate about its own axis at 4,000 r.p.m. The resulting liquid layer is of the approximate thickness of 4,000 Angstrom units. The wetted substrate is next air dried at room temperature for a period of about 1 hour after which time the polymer is dry to the touch. It is then annealed at about 120° C for a period of 1 hour in air. Oxidation is carried out in a tube furnace of approximate dimensions 1.5 inches by 3 feet with oxygen flow of 5 liters per minute. Oxidation is carried out with increasing temperature at a rate of 10° C per minute from room temperature to 380° C and is maintained at this final temperature for a period of 2 hours. Resulting oxidized film thickness is approximately 2,500 Angstrom units. The final film shows no long range ordering beyond 50 Angstrom units as determined by X-ray powder diffraction (powder scraped from substrate surface). Transmission is greater than 30 percent at 5,890 Angstrom units wavelength and less than 1 percent at 3,980 Angstrom units. The resultant film is pattern-delineated by first applying a negative resist exposing through a photolithographic mask with 3,100 to 4,100 Angstrom units wavelength light following which the resist is developed to yield an image. The entirety is dipped in 6N HCl at room temperature and kept immersed for 3 minutes following which it is removed and rinsed in water. The resist is then removed by immersion in a solvent and the final product is rinsed and air dried. Image resolution is equal to that of the photographic negative.

b. The above procedure is followed except that the dried polymer is pattern-delineated by use of a programmed electron beam of 5,000 ev energy with an integrated dosage of about $10 \times 10^{-5}$ coulombs per square centimeter defining a desired pattern. Oxidation is carried out under the conditions of Example (a). The pattern delineation of oxide material is omitted. Resolution is of the order of better than 1 $\mu$m.

c. The procedure of Example (b) is followed, however, carrying the oxidation procedure to a temperature maximum of 480° C. The appearance of the final product is similar to that of Example (b); however, whereas, the oxide pattern of Example (b) is soluble at 6N HCl in a period of about 3 minutes, immersion of this product in such acidic medium results in no discernible dissolution in a period of 1 hour.

d. The procedure of Example (a) is followed, however, utilizing an electron delineation technique in lieu of a photoresist technique. The oxide blank is pattern-delineated utilizing a programmed electron beam at an energy of 10 kV at a current of about $10^{-7}$ amperes in a beam diameter of about 1,000 Angstrom units and a scan rate of 0.4 cm/second following which the substrate bearing the oxide layer is immersed in 6N HCl at room temperature for a period of about 3 minutes. Substrate and coating are withdrawn, rinsed, and dried and pattern defined by the programmed electron beam having a resolution of better than 1 $\mu$m results.

e. The procedure of Example (d) is repeated, however, substituting a laser beam produced by an argon ion laser operating at 5145 Angstrom units. Beam diameter was approximately 50 $\mu$m and power density of about 300 watts/millimeter$^2$. The beam was moved at a rate of about 3 cm/sec. resulting in exposure time of about $10^{-3}$ sec. The resulting product was similar to that of Example (d).

The procedures of (a),(b),(c),(d), and (e) are repeated however, with a substituted polyvinyl ferrocene—i.e., vinyl ferrocene carboxylic acid. Results are, in each instance, substantially identical.

What is claimed is:

1. A procedure for the fabrication of an article including a substrate having thereon a patterned film comprising at least one oxidized iron compound comprising the steps of:
    depositing on the said substrate a solvent solution consisting essentially of a polymerized product, the said polymerized product consisting essentially of at least one addition polymer of a monomer, said polymer having a molecular weight of at least 3,000 Mv, said monomer consisting essentially of two five-membered carbonaceous rings and a $\pi$-bonded iron atom, the said rings including at least one substituent, one substituent being a mono-olefinic hydrocarbon side chain, any further substituents being saturated;
    removing solvent thereby leaving a residuum consisting essentially of a layer of dried polymer product;
    oxidizing the said layer so as to convert substantially all of the dried polymer product, thereby producing a film comprising at least one compound consisting of an oxide or iron, said procedure including a procedural step resulting in patterning of the said film.

2. Procedure of claim 1 in which said patterning results from removal of a portion of the said film.

3. Procedure of claim 2 in which removal is by selective etching of a portion of the film.

4. Procedure of claim 1 in which said patterning of the film results from patterning of the said layer.

5. Procedure of claim 4 in which patterning of the said layer is produced by the said depositing selectively of the said layer on the substrate.

6. Procedure of claim 4 in which patterning of the said layer is produced by selective removal of the said layer prior to the oxidation thereof.

7. Procedure of claim 6 in which patterning of the said layer is produced by cross-linking selected portions thereof and by wetting the said layer with a solvent which selectively removes uncross-linked portions.

8. Procedure of claim 7 in which cross-linking is produced by electron beam irradiation of the said portions.

9. Procedure of claim 8 in which cross-linking is sufficient to result in retention of at least 90 percent of the irradiated portions of the said layer after wetting with the said solvent.

10. Procedure of claim 9 in which the said layer is of the thickness of at least 4,000 Angstrom units and in which the electron beam is at least 5 kV.

* * * * *

UNITED STATES PATENT AND TRADEMARK OFFICE
CERTIFICATE OF CORRECTION

PATENT NO. : 4,027,052
DATED : May 31, 1977
INVENTOR(S) : Larry F. Thompson

It is certified that error appears in the above—identified patent and that said Letters Patent are hereby corrected as shown below:

Column 6, line 31, "100°-1/8°C." should read --100°-150°C.--. Column 9, line 14, "to" should read --of--; line 62, "electron delineation" should read --electron beam delineation--. Column 10, line 67, "electron beam is" should read --electron beam voltage is--.

Signed and Sealed this

Fourth Day of July 1978

[SEAL]

Attest:

RUTH C. MASON
*Attesting Officer*

DONALD W. BANNER
*Commissioner of Patents and Trademarks*